United States Patent [19]
Ishikawa

[11] Patent Number: 5,841,152
[45] Date of Patent: Nov. 24, 1998

[54] OPTICAL SEMICONDUCTOR DEVICE PROVIDED WITH STRAINED QUANTUM WELL LAYER FORMED ON A TERNARY COMPOUND SEMICONDUCTOR SUBSTRATE

[75] Inventor: Hiroshi Ishikawa, Kawasaki, Japan

[73] Assignee: Fujitsu Limited, Kawasaki, Japan

[21] Appl. No.: 843,963

[22] Filed: Apr. 17, 1997

Related U.S. Application Data

[63] Continuation of Ser. No. 700,088, Aug. 20, 1996, abandoned, which is a continuation of Ser. No. 190,366, Feb. 2, 1994, abandoned.

[30] Foreign Application Priority Data

Mar. 23, 1993 [JP] Japan .................................. 5-063778

[51] Int. Cl.$^6$ .................................................. H01L 29/06
[52] U.S. Cl. .......................... 257/14; 257/17; 257/18; 257/22; 257/96; 257/190
[58] Field of Search ........................ 372/45, 46; 257/13, 257/14, 15, 17, 18, 22, 96, 94, 190, 184

[56] References Cited

U.S. PATENT DOCUMENTS

| | | | |
|---|---|---|---|
| 4,719,155 | 1/1988 | Matsumoto | 257/94 |
| 5,045,897 | 9/1991 | Ahlgren | 257/94 |
| 5,068,868 | 11/1991 | Deppe et al. | 257/14 |
| 5,181,086 | 1/1993 | Yoshida | 257/18 |
| 5,294,833 | 3/1994 | Schetzina | 257/94 |

FOREIGN PATENT DOCUMENTS

| | | | |
|---|---|---|---|
| 0 157 602 | 3/1985 | European Pat. Off. | 372/45 |
| 63-237590 | 10/1988 | Japan | 257/190 |
| 4-372188 | 12/1992 | Japan | 372/45 |

OTHER PUBLICATIONS

"InGaAs strained quantum wells with a 1.3μm band edge at room temperature", *Appl. Phys. Lett* 55(14), Oct. 1989, pp. 1436–1438, Melman et al.

Low Threshold 0.98 μm Aluminium–Free Strained Quantum–Well InGaAs/InGaAsP/InGaP Lasers, *Electronics Letters* 29(1), Jan. 1993, pp. 1–2, Chang–Hasnain et al.

"Theoretical gain of strianed quantum well grown on an InGaAs ternary substrate", *Appl. Phys. Lett.* 63(6), Aug. 1993, pp. 712–714, Ishikawa.

*Primary Examiner*—Minh-Loan Tran
*Attorney, Agent, or Firm*—Staas & Halsey

[57] ABSTRACT

An optical semiconductor device provided with a strained quantum well layer uses a ternary mixed-crystal compound semiconductor substrate on which a strained quantum well layer sandwiched by barrier layers is formed.

14 Claims, 9 Drawing Sheets

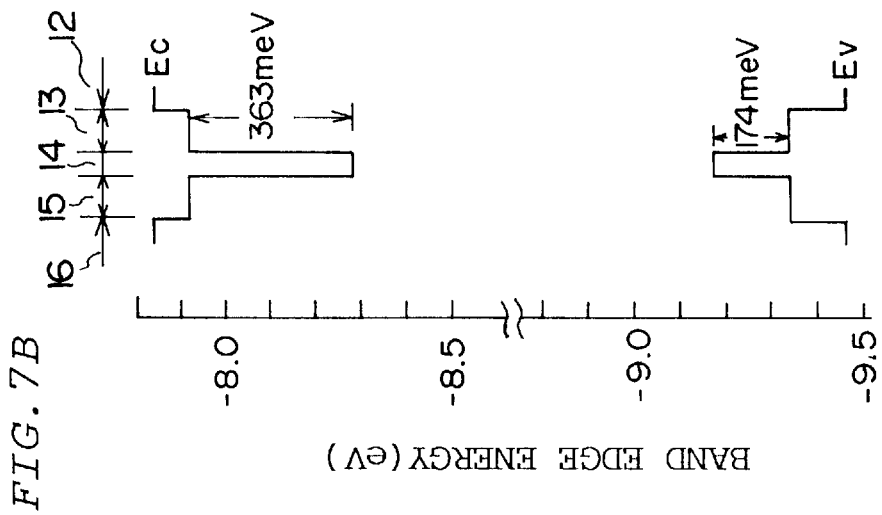
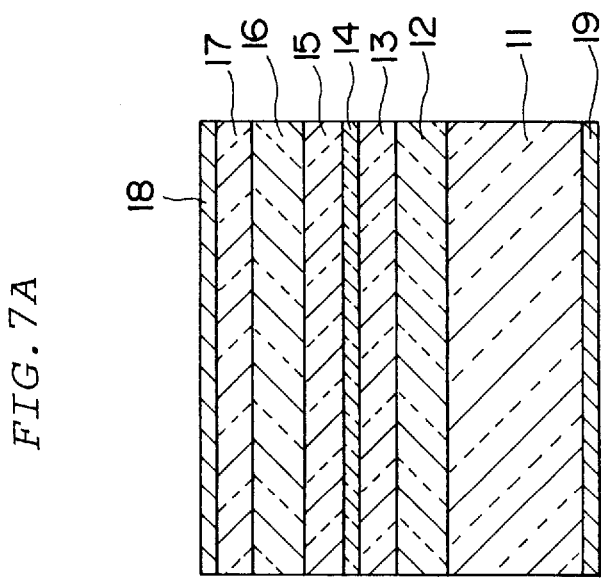

OPTICAL SEMICONDUCTOR DEVICE PROVIDED WITH STRAINED QUANTUM WELL LAYER FORMED ON A TERNARY COMPOUND SEMICONDUCTOR SUBSTRATE

This application is a continuation of application Ser. No. 08/700,088, filed Aug. 20, 1996, now abandoned, which is a continuation of application Ser. No. 08/190,366, filed Feb. 2, 1994, now abandoned.

BACKGROUND OF THE INVENTION

1. Field of the Invention

The present invention relates to an optical semiconductor device provided with a strained quantum well, particularly to an optical semiconductor device such as a semiconductor laser or semiconductor light amplifier having a strained quantum well.

2. Description of the Related Art

An optical data processing system is remarkably advancing, and it is estimated that the system is widely used for the field of optical communication of the subscriber system in future. In this case, a semiconductor laser serving as a light source is used under a severe thermal condition and a small power consumption is naturally requested for the laser as a matter of course.

For example, as an optical semiconductor device consuming a small power and having a high efficiency and having a small temperature dependence, a semiconductor laser having a strained quantum well is researched and developed.

The optical semiconductor device such as a semiconductor laser or semiconductor light amplifier is formed by using a substrate made of InP or GaAs, which is completed by passing through various steps including the steps of growing crystal on the substrate and forming electrodes. To grow the crystal, it is popular to select a material lattice-matched to a substrate material mainly. Moreover, a strained quantum well structure made of a material with a different lattice constant is also used. A strained quantum well layer is constituted so that the composition of a multi-compound material does not lattice-match a barrier layer and a substrate and misfit dislocation in the layer does not occur by adjusting a film thickness to below the critical thickness. This type of strained quantum well is applied to, for example, the active layer of a semiconductor laser, in which the state density of an energy band structure is changed by adding a strain. Hereby, characteristics of the semiconductor laser are improved. However, in the prior art, because the material of an substrate is restricted to InP or GaAs, the material of barrier layers sandwiching a strained quantum well layer is restricted to AlGaAs lattice-matched to a GaAs substrate, or to InP, InGaAsP, InAlAsP, ZnGaAlAsP or InAlAs having a composition lattice-matched to a InP substrate.

The oscillation wavelength of the semiconductor laser comprising this type of strained quantum well structure is restricted up to 1.0 $\mu$m due to a lattice constant and strain limit in case of using GaAs as a substrate. A laser with a band from 1.2 to 1.6 $\mu$m which is demanded a wavelength in optical communication is not made. By using InP as a substrate, it is possible to realize a laser with a band from 1.2 to 1.6 $\mu$m. However, because the depth of a well to a barrier layer is small, any adequate characteristic of the semiconductor laser with a small temperature dependence is not obtained.

Therefore, the prior art has problems that the range for selecting a material comprising a strained quantum well structure is narrow and the oscillation wavelength and the depth of a potential well are naturally restricted. The depth of the potential well is an important factor to obtain a high performance in the case of a semiconductor laser provided with a strained quantum well. Therefore, a deeper strained quantum well is requested.

Next, FIGS. 1A and 1B show the depths of a semiconductor laser using an InP substrate and having the oscillation wavelength of 1.3 $\mu$m.

FIG. 1A shows an energy band of a quantum well comprising an InGaAsP quantum well layer and an InP barrier layer and FIG. 1B shows an energy band of an SCH structure quantum well (separate confinement heterostructure) obtained by forming light-confinement and barrier layer made of InGaAsP with different compositions from the well layer.

SUMMARY OF THE INVENTION

It is an object of the present invention to provide an optical semiconductor device for deepening a potential well comprising a strained quantum well structure and moreover improving the temperature dependency.

The present invention provides an optical semiconductor device in which a strained quantum well structure is formed on a ternary mixed-crystal compound semiconductor substrate.

By using ternary mixed-crystal compound semiconductor as a substrate, the range for selecting materials serving as a strained quantum well (active layer) and a barrier (cladding layer) widens and it is possible to select an oscillation wavelength and the optimum band gap. Therefore, by selecting a substrate made of a ternary material with the optimum composition to form a deep-potential strained quantum well layer, the interval between heavy hole subbands or that between heavy and light hole subbands widens in the case of a strained quantum well of a valence band. As a result, the effective mass of the heavy hold band decreases. The increase in the subband separation also takes place in conduction band due to the deep potential well. The large subband separation in the valence band and conduction band reduces the carrier distribution to the upper subbands. The reduced effective mass in the valence band decrease the density of state of hole subband. Owing to these effects, oscillation occurs at a small carrier density, and the carrier density is hardly subject to a temperature change. Moreover, because the potential deepens, the probability for carriers to overflow from a quantum well decreases and the efficiency of an optical semiconductor device increases.

BRIEF DESCRIPTION OF THE DRAWINGS

FIG. 7A is a sectional view of the optical semiconductor device of the second embodiment of the present invention provided with a strained quantum well and FIG. 7B is a band diagram showing the potential well of the device;

DESCRIPTION OF THE PREFERRED EMBODIMENTS

The present invention is based on a new theoretical knowledge that the performance of an optical semiconductor device having a strained quantum well layer is greatly improved by deepening the potential of the strained quantum well and a new conception that it is necessary to use ternary crystal such as InGaAs as a material serving as a substrate where crystal is grown in order to deepen the potential of a quantum well.

The following is the description of the fact that the performance of the strained quantum well is improved by deepening the potential of the quantum well.

To deepen the potential of the strained quantum well layer, it is necessary to raise the potential of a barrier layer enclosing the strained quantum well layer. For an optical semiconductor device using an InP or GaAs substrate, materials of quantum well (active layer) and barrier layers are restricted depending on the lattice constant of the substrate.

However, by using semiconductor of ternary compound crystal as a substrate, the range for selecting materials of quantum well (active layer) and barrier layers widens and it is possible to select an oscillation wavelength and a heterojunction material for realizing the optimum band gap.

Figure 1A:
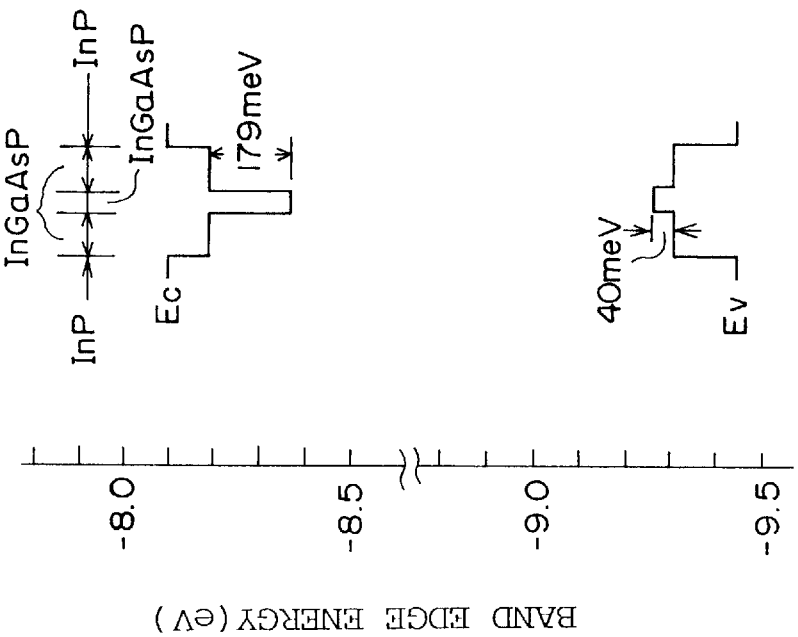
FIG. 1A is a diagram showing an energy band of a quantum well formed on an InP substrate and FIG. 1B is a diagram showing an energy band of an SCH structure quantum well structure quantum well formed on an InP substrate.
Figure 4:
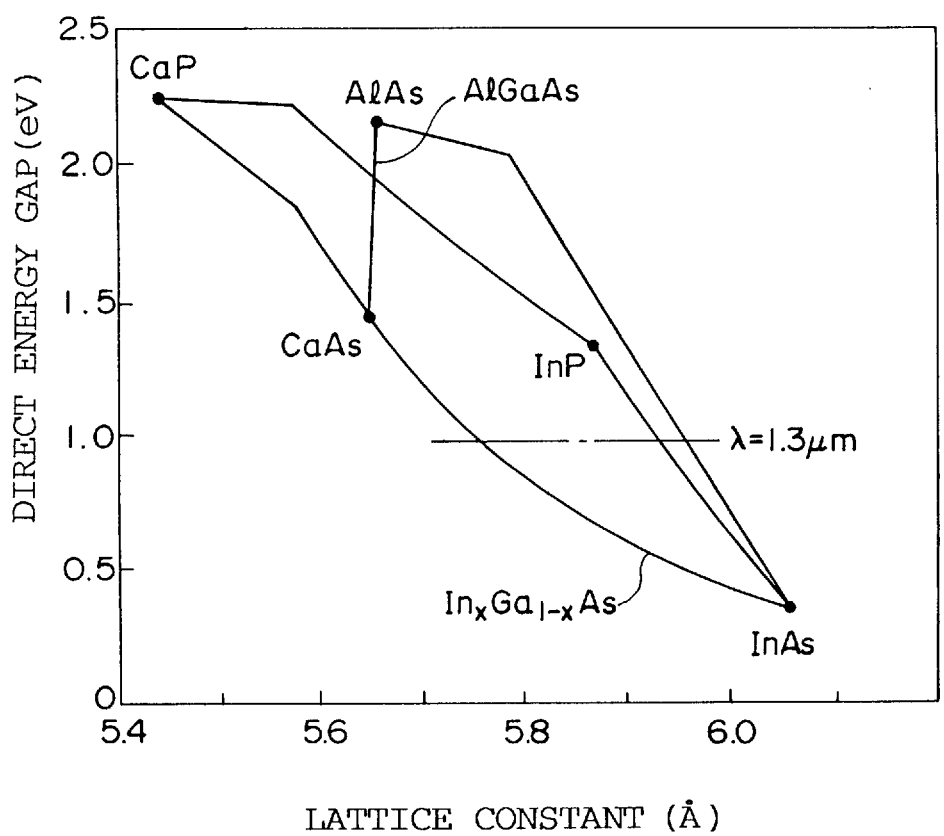
FIG. 4 is a diagram showing the relationship between lattice constant and energy gap of a III-V-group semiconductor, in which the axis of ordinates represents direct energy gap without considering strain, the axis of abscissas represents lattice constant, the line connecting GaAs and InAs represents InGaAs with different composition ratios, the line connecting InP and InAs represents InAsP with different composition ratios, the line connecting GaAs and GaP represents GaAsP with different composition ratios, the line connecting GaP and InP represents InGaP with different composition ratios, the region enclosed by these lines represents InGaAsP with different composition ratios, the line connecting GaAs and AlAs represents AlGaAs with different composition ratios, the region enclosed by InAlAs, AlGaAs and InGaAs represents AlGaInAs with different composition ratios.
Figure 5B:
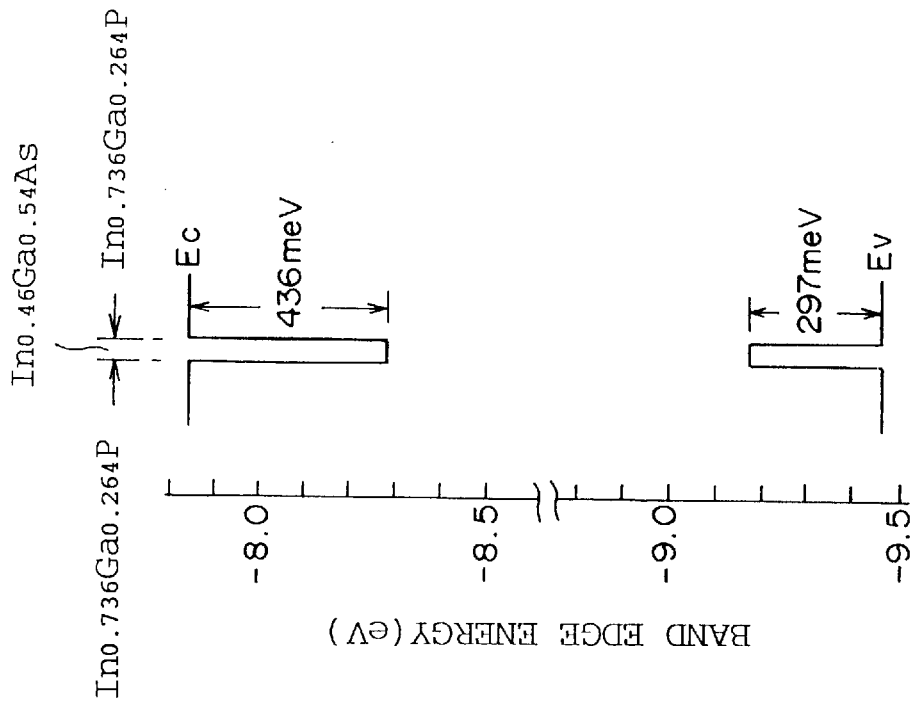
FIG. 5A is a sectional view of an optical semiconductor device provided with a strained quantum well of a first embodiment of the present invention and FIG. 5B is a band diagram showing a potential well of the device.
Figure 5A:
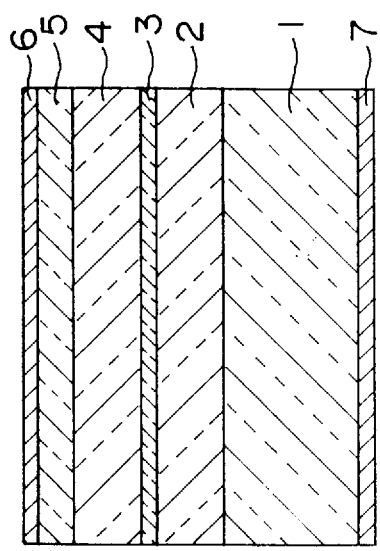

For example, when $In_{0.48}Ga_{0.54}As$ is used as a strained quantum well layer so that the maximum gain wavelength $\lambda$ comes to 1.3 $\mu$m and InGaP is used as the material of barrier layers sandwiching the strained quantum well layer so that the strain of the strained quantum well layer comes to 1.4%, it is found from FIG. 4 that for example the substrate material lattice-matched to the InGaP barrier layer is ternary, InGaAs not GaAs or InP. Thereby, the difference between band gaps of the barrier layer and strained quantum well layer increases as shown in FIGS. 5A and 5B and resultingly the quantum well further deepens compared with the case in which the InP substrate shown In FIG. 1A is used.

Therefore, by selecting a substrate made of a ternary material with the optimum composition to form a strained quantum well layer with a deep potential, the energy interval between heavy hole subbands or between heavy and light hole subbands increases in the case of a valence-band strained quantum well layer. As a result, the effective mass of the heavy hole band decreases, the density of states decreases. The increase in the energy interval of subband also takes place in the conduction band. Due to these effects, oscillation at the low carrier density is realized. Thus, the influence of a temperature change on carrier density decreases.

As described above, a semiconductor laser using a ternary material substrate increases the gain and the temperature dependence of the gain decreases.

FIG. 4 shows the relationship between lattice constant and energy of III-V-group semiconductor.

In FIG. 4, the line connecting GaAs and InAs is a locus when changing the value of "x" of $In_xGa_{1-x}As$. The composition ratio "x" is larger than 0 and smaller than 1. Thus, the composition ratio approaches GaAs as "x" gets closer to 0. For example, to form a semiconductor laser by using an $In_xGa_{1-x}As$ substrate with a composition on the line, a barrier layer material for deepening the potential of a quantum well is selected to realize a semiconductor laser provided with a strained quantum well layer with a band between 1.2 and 1.6 $\mu$m in a wavelength band having a gain characteristic with a small temperature dependence.

Figure 1B:
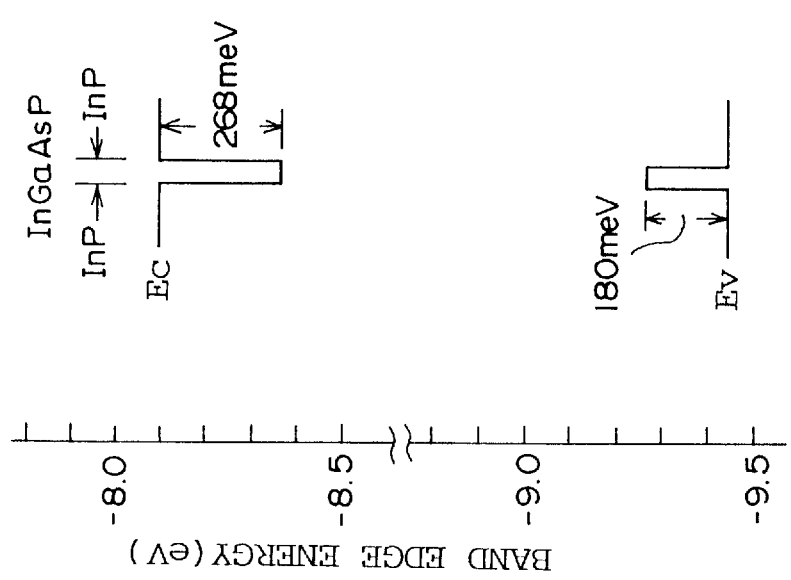

The following is the description of an embodiment of an optical semiconductor device using the above theory. Before describing the embodiments, FIG. 2 shows the subband of the strained quantum well layer comprising the SCH structure quantum well shown in FIG. 1B in order to compare these embodiments with an embodiment according to the prior art before.

Figure 2:
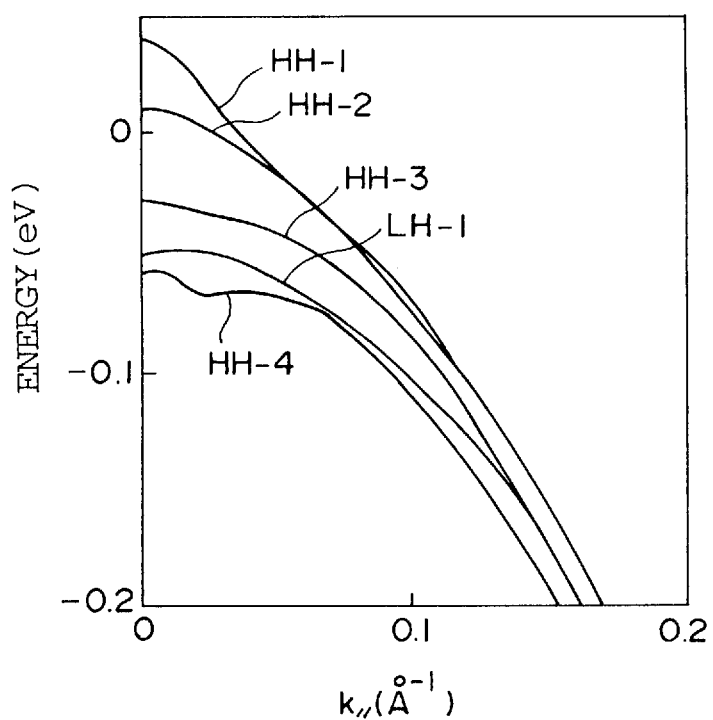
FIG. 2 is a diagram showing the relationship between inplane wavenumber and energy of a subband of a valence band of a quantum well comprising an SCH structure quantum well structure quantum well formed on an InP substrate.
Figure 3:
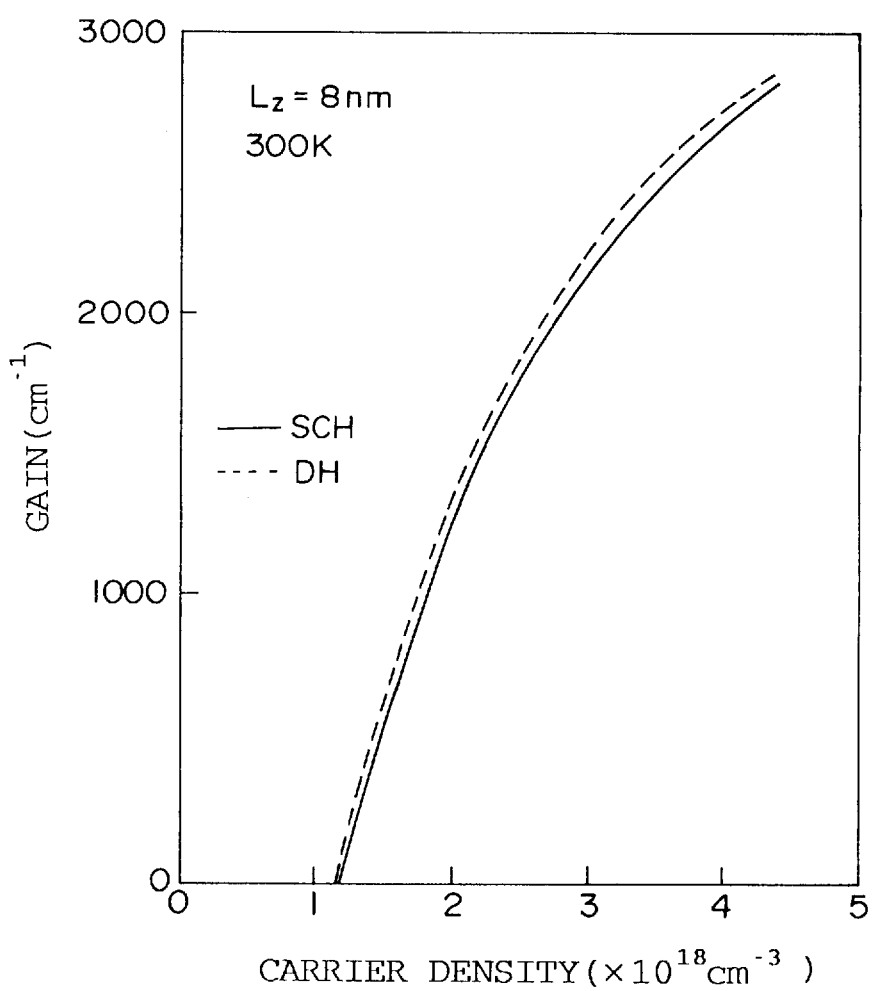
FIG. 3 is a diagram showing the relationship between carrier density and gain of a semiconductor laser formed on an InP substrate.

The axis of ordinates in FIG. 2 represents energy incorporating the change of hydrostatic deformation potential and the axis of abscissas represents inplane wavenumber $k_{//}$. From FIG. 2, it is found that the heavy hole bands HH-1 to HH-4 come close to the light hole band LH-1. FIG. 3 shows the relationship between carrier density and gain of each of the DH and SCH structure quantum well shown in FIGS. 1A and 1B, in which the continuous line represents the characteristic of SCH structure quantum well. These are calculation results by the inventor of the present application.

(First example)

FIG. 5A is a sectional view of the semiconductor laser of the first example of the present invention and FIG. 5B is an energy band diagram of the laser. The sectional view shows a structure in which a deep quantum well is obtained at the oscillation wavelength of 1.3 $\mu$m which is the most important wavelength band for optical communication.

In FIG. 5A, symbol 1 is an n-type compound semiconductor substrate using $In_xGa_{1-x}As$ (x=0.26) as a ternary material, on which an n-$In_{0.736}Ga_{0.264}P$ cladding layer 2, a non-doped $In_{0.46}Ga_{0.54}As$ active layer 3, a p-$In_{0.736}Ga_{0.264}P$ cladding layer 4, and a p$^+$-type $In_{0.26}Ga_{0.74}As$ contact layer 5 are deposited in order. Moreover, a p-electrode 6 is formed on the contact layer 5 and an n-electrode 7 is formed under the substrate 1. For the band structure in this case, the active layer 3 serves as a strained quantum well layer and the cladding layer 2 serves as a barrier layer.

For this type of material, as shown in FIG. 4, the lattice constant of the substrate 1 matches that of the cladding layer 2 and 4, the lattice constant of the active layer 3 does not coincide with those of the cladding layers 2 and 4, and an compressive strain is added to the active layer 3 to form a strained quantum well layer. The strain expressed as the ratio of lattice constants comes to compressive strain of 1.4%. When setting the thickness Lz of the active layer 3 to approx. 8 nm, the maximum gain is obtained at the wavelength of approx. 1.3 μm.

FIG. 5B shows calculation examples of a quantum well, and the quantum well shows the well depth of 436 meV in the conduction band and 297 meV in the valence band. Thus, it is found that the quantum well deepens compared with that of the prior art shown in FIG. 1A. When the quantum well deepens, the energy difference between subbands increases due to the quantum size effect. For the band structure according to the effects of the deep quantum well, carriers are efficiently distributed in the lowest band and thereby the gain increases. Moreover, carriers hardly overflow a barrier due to the deep quantum well and the carrier efficiency for transition rises.

Figure 6:
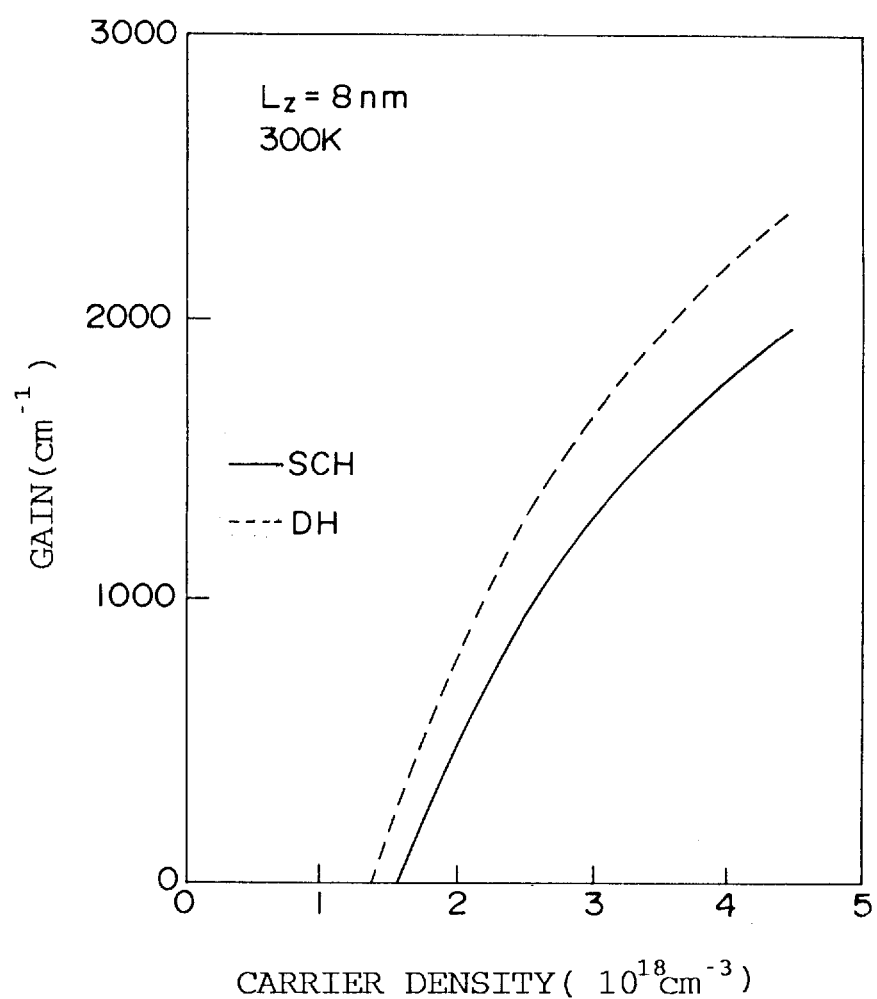
FIG. 6 is a diagram showing the relationship between carrier density and gain of the strained quantum well layer of the optical semiconductor device of the second embodiment of the present invention.

As the result of examining the relationship between carrier density and gain of the active layer 3, it is found that the characteristic shown by the broken line in FIG. 6 is obtained and the gain increases compared with the characteristic of the quantum well formed on an InP substrate shown by the broken line in FIG. 3.

By using the strained quantum well structure with a high gain, a semiconductor with a low threshold, high efficiency, and large output is obtained. Moreover, because the interval between subbands increases, the change of the characteristic when changing temperature becomes very small.

(Second example)

In the above first example, a semiconductor laser without SCH structure quantum well structure DH is described. A device comprising an SCH structure quantum well is described below.

FIG. 7A is a sectional view of a semiconductor laser of the second example of the present invention and FIG. 7B is an energy band diagram of the laser.

In FIG. 7A, symbol 11 is a compound semiconductor substrate using InxGa1-xAs (x=0.26) as a ternary material, on which an n-$In_{0.736}Ga_{0.264}P$ cladding layer 12, an light-confinement and barrier layer 13 made of non-doped $In_{0.61}Ga_{0.39}As_{0.27}P_{0.93}$, a active layer 14 made of a non-doped $In_{0.46}Ga_{0.54}As$, a light-confinement and barrier layer 15 made non-doped $In_{0.61}Ga_{0.39}As_{0.27}P_{0.93}$, a p-$In_{0.736}Ga_{0.264}P$ cladding layer 16, and a p$^+$-$In_{0.26}Ga_{0.74}As$ contact layer 17 are formed in order. Moreover, a p-electrode 18 is formed on the contact layer 17 and an n-electrode 19 is formed under the substrate 11. The thickness Lz of the active layer 14 is set to approx. 8 nm. Thereby, the wavelength realizing the maximum gain comes to 1.31 to 1.33 μm.

For the band structure in this case, the active layer 14 serves as a strained quantum well layer and the layers 13 and 15 as light-confinement-and-barrier. The layers 12 and 16 serve as cladding layers.

For the relationship between lattice constant and energy in this case, it is found from FIG. 4 that the potential at the band edge of the strained quantum well layer deepens for the barrier layer.

Figure 8:
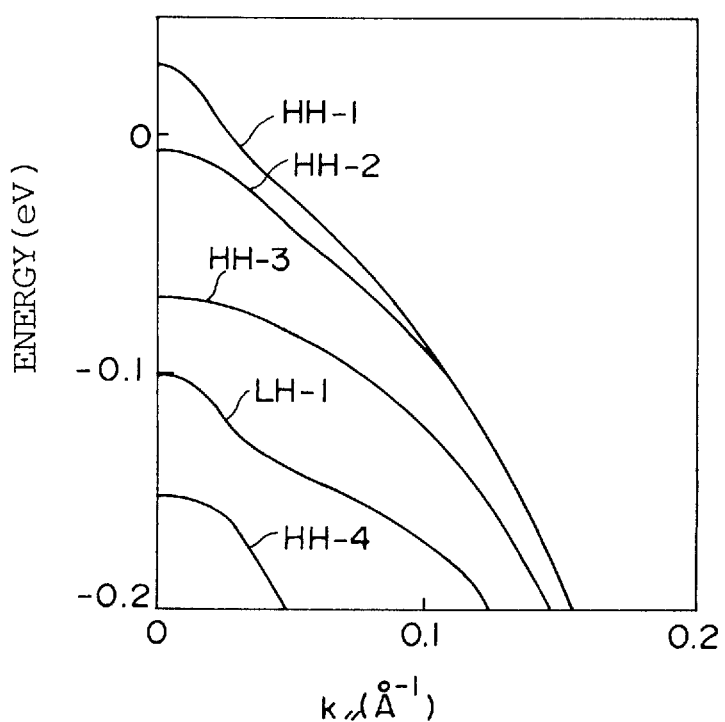
FIG. 8 is a diagram showing the relationship between inplane wavenumber and energy of a subband in the valence band of the quantum well layer of the second embodiment of the present invention.

FIG. 7B shows the result of calculating the depth of the quantum well. From FIG. 7B, it is found that the depth of the quantum well in the conduction band increases to 363 meV and that in the valence band increases to 174 meV. FIG. 8 shows the result of calculating the band structure dispersed by the valence band on the potential of the quantum well. The axis of ordinates in FIG. 8 represents energy incorporating the change of hydrostatic deformation potential. The axis of abscissas in FIG. 8 represents inplane wavenumber $k_{//}$.

As the result of comparing the subband in the valence band of the strained quantum well layer of this embodiment shown in FIG. 8 with the subband in the valence band of the strained quantum well structure on the InP substrate shown in FIG. 2, it is found that the energy difference of the subband of this embodiment at $k_{//}=0$ is larger. Moreover, it is found that, as the energy difference increases, the distance between light hole band LH and heavy hole band HH increases and the effective mass of the heavy hole band HH decreases.

The continuous line in FIG. 6 shows the result of calculating the gain of the semiconductor laser using the band structure of this embodiment. From FIG. 6, it is confirmed that the gain is larger than that of the prior art shown in FIG. 3. Moreover, for a deep quantum well, because of the suppression of carrier overflow the change of gain gets small even if temperature is changed and a semiconductor laser with a small temperature dependency is obtained.

Thus, it is theoretically clarified that gain increases by increasing the depth of a quantum well.

When an InP substrate is used, the material of a barrier layer for obtaining the deepest quantum well is InP or InAlAs. However, it is restricted to form a deep quantum well and the characteristic is also restricted.

This example makes it possible to form a deep quantum well, realize a large gain, and provide a high-performance semiconductor laser with a very-small temperature dependency by using InGaAs as a substrate instead of using InP.

(Third example)

The above examples use InGaAs for a barrier layer. However, InAlAs can also be used for the barrier layer whose structure is shown in FIG. 9.

Figure 9:
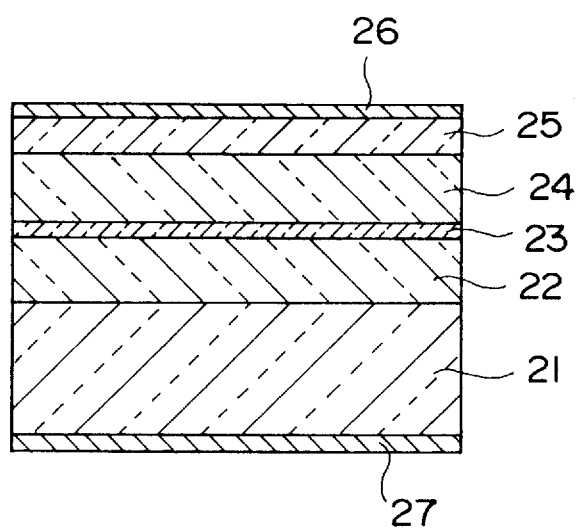
FIG. 9 is a sectional view of the optical semiconductor device of the third embodiment of the present invention provided with a strained quantum well.

In FIG. 9, an n-$In_yAl_{1-y}As$ (y=0.25) cladding layer 22, non-doped $In_{0.46}Ga_{0.54}As$ active layer 23, p-$In_yAl_{1-y}As$ cladding layer 24, and p$^+$-$In_yAl_{1-y}As$ contact layer 25 are formed on an n-$In_{0.26}Ga_{0.74}As$ substrate 21. Moreover, p-electrode 26 is formed on the contact layer 25 and an n-electrode 27 is formed under the substrate 21.

In this case, the active layer 23 serves as a strained quantum well layer and the cladding layers 22 and 24 serve as barrier layers.

From FIG. 4, it is found that the energy difference between the barrier layers and the strained quantum well layer gets larger than the cases of the above-mentioned two embodiments, the quantum well becomes deeper, a high gain is obtained, and the temperature dependency decreases.

(Other example)

For the above-mention, a semiconductor laser is used as an example. Moreover, it is also possible to form a semiconductor light-amplifying device by using the same structure as the semiconductor laser. When the semiconductor light-amplifying device is used, the current is flowing from a p-type impurity region to an n-type impurity region slightly smaller than a threshold. Then, light to be amplified is applied to an light input end of the device, therefore the semiconductor light-amplifying device amplify the light and outputs the amplified light from its output end.

The above examples use a single quantum well. Further, it is possible to apply the above quantum well to a multiple quantum well structure having a plurality of strained quantum well layers through barrier layers. Moreover, for the single quantum well, it is possible to increase the light confinement coefficient by using a material with an intermediate composition giving the band gap between cladding layer and well layer while keeping the well depth sufficiently deep.

The wavelength of a semiconductor laser comprising a strained quantum well structure is determined by the material, strain, depth or width of the well.

It is described above that $In_xGa_{1-x}As$ (0<x<1) is used as a substrate material in order to widen the range for selecting a material of a quantum well. The above embodiments use $In_{0.26}Ga_{0.74}As$ as the substrate material, moreover, by using a ternary mixed crystal with another composition for a substrate, it is also possible to use every material for deepening a potential of a quantum well without being restricted by the lattice constant of the compound semiconductor substrate according to the prior art. It is necessary to keep the composition ratio "x" of $In_xGa_{1-x}As$ in the range of 0<x<1. Further, to completely bring out the feature of a ternary mixed-crystal substrate, it is preferable to keep the ratio "x" in the range between 0.05 and 0.95.

When $In_xGa_{1-x}As$ is used as a substrate material, it is possible to use $In_yGa_{1-y}As$ with the same composition ratio or different composition ratios as the material of a strained quantum well or use InGaAsP as the material of the well. In this case, a barrier layer uses one of InGaP, InGaAsP, InAlAs, AlInAsP and AlGaInAsP. The composition ratio is properly selected according to the wavelength of the laser.

For the above embodiments, a compressive strain is adopted as the strain of a quantum well layer. However, a tensile strain can also be adopted. The compressive strain widens the band gap of the quantum well and the tensile strain narrows the band gap of it.

For the subband of a strained quantum well, as the film thickness of a quantum well decreases, the interval of the subbands increases, the potential of the subband rises, and the wavelength of outputted light comes to short. However, because the film thickness of a quantum well layer has a critical value, it is necessary to keep the thickness at the critical layer thickness or less. When the potential of a strained quantum well deepens, the carriers having energy between subbands is efficiently distributed in the lowest-level subband by the quantum effect and thereby the gain increases, the carriers overflowing from a quantum well decrease and the injection efficiency is improved. Because the depth of the potential of the strained quantum well depends on the difference between the potentials of the strained quantum well and a barrier layer, it is also necessary to consider the material and composition of the barrier layer.

By adjusting the above factors, a laser beam with a band of 1.2 to 1.6 μm is realized which is a wavelength demanded for optical communication field. For example, by using $In_{0.41}Ga_{0.59}As$ as a quantum well and $In_{0.21}Ga_{0.79}As$ as a substrate, the maximum gain is obtain at the wavelength of approx. 1.2 μm. And, by using $In_{0.65}Ga_{0.35}As$ quantum well and $In_{0.45}Ga_{0.55}As$ substrate, the maximum gain is obtain at the wavelength of approx. 1.6 μm.

As described above, the present invention makes it possible to form a deep quantum well which cannot be realized by a binary mixed-crystal substrate of prior art and greatly improve the performance of an optical semiconductor device by increasing the difference between subbands of the well because a ternary mixed-crystal compound semiconductor substrate is used so as to form a strained quantum well structure sandwiched by barrier layers on the substrate.

What is claimed is:

1. A heterostructure optical semiconductor device comprising:
   a compound semiconductor substrate made of a ternary crystal formed from elements of groups III and V;
   first and second barrier layers formed on the compound semiconductor substrate, the first and second barrier layers having respective lattice constants that are substantially the same as that of the compound semiconductor substrate, the first and second barrier layers having respective energy gaps that are larger than that of the compound semiconductor substrate;
   third and fourth barrier layers formed between the first and second barrier layers and having respective lattice constants that are substantially the same as those of the first and second barrier layers and the compound semiconductor substrate, the third and fourth barrier layers having respective energy gaps that are smaller than those of the first and second barrier layers; and
   a strained quantum well layer sandwiched between the third and fourth barrier layers, the strained quantum well layer having a lattice constant that is substantially different from those of the compound semiconductor substrate and the first through fourth barrier layers to cause strain therein, the strained quantum well having an energy gap that is smaller than those of the third and fourth barrier layers, the first through fourth barrier layers and the strained quantum well layer being formed from elements of Groups III and V,
   the third and fourth barrier layers acting as optical confinement layers to confine light in the strained quantum well layer, and
   the third and fourth barrier layers and the strained quantum well layer respectively having band edges, the band edges of the strained quantum well layer constituting a deeper potential well with respect to the band edges of the third and fourth barrier layers.

2. The optical semiconductor device according to claim 1, wherein the strain caused in the strained quantum well layer is a compressive strain.

3. The optical semiconductor device according to claim 1, wherein the strain caused in the strained quantum well layer is a tensile strain.

4. The optical semiconductor device according to claim 1, wherein a plurality of strained quantum well layers are provided on the compound semiconductor substrate.

5. The optical semiconductor device according to claim 1, wherein the compound semiconductor substrate is formed of $In_xGa_{1-x}As$ with a composition ratio x in a range of 0<x<1.

6. The optical semiconductor device according to claim 1, wherein said semiconductor substrate is formed of $In_xGa_{1-x}As$ with a composition ratio x in a range of 0.05<x<0.95.

7. The optical semiconductor device according to claim 6, wherein the strained quantum well layer is formed of $In_yGa_{1-y}As$ with a composition ratio y that is different from the composition ratio x.

8. The optical semiconductor device according to claim 1, wherein the strained quantum well layer has a thickness less than or equal to a critical film thickness to avoid a misfit dislocation.

9. The optical semiconductor device according to claim 1, wherein the strained quantum well layer is formed of InGaAsP.

10. The optical semiconductor device according to claim 1, wherein the first and second barrier layers are formed of a material selected from the group consisting of InGaP, InGaAsP, InAlAs, AlInAsP, and AlGaInAsP.

11. The optical semiconductor device according to claim 1, wherein the compound semiconductor substrate is formed of InGaAs, the first and second barrier layers are formed of InGaP, the third and fourth barrier layers are formed of InGaAsP, and the strained quantum well layer is formed of InGaAs.

12. The optical semiconductor device according to claim 1, wherein the compound semiconductor substrate, the first through fourth barrier layers, and the strained quantum well layer are formed of materials selected to provide maximum gains for the compound semiconductor substrate, the first through fourth barrier layers, and the strained quantum well layer in a wavelength range of 1.2 to 1.6 $\mu$m, and the strained quantum well layer has a thickness selected to attain a wavelength of 1.2 to 1.6 $\mu$m.

13. The optical semiconductor device according to claim 1, wherein in the conduction band, the strained quantum well layer has a deeper potential well of at least 262 meV with respect to the band edges of the third and fourth barrier layers.

14. The optical semiconductor device according to claim 1, wherein in the valence band, the quantum well layer has a deeper potential well of at least 174 meV with respect to the band edges of the third and fourth barrier layers.

* * * * *